United States Patent [19]

Hoppe

[11] Patent Number: 4,599,736
[45] Date of Patent: Jul. 8, 1986

[54] WIDE BAND CONSTANT DUTY CYCLE PULSE TRAIN PROCESSING CIRCUIT

[75] Inventor: Karl-Heinz Hoppe, Wallerstädten, Fed. Rep. of Germany

[73] Assignee: Robert Bosch GmbH, Stuttgart, Fed. Rep. of Germany

[21] Appl. No.: 632,582

[22] Filed: Jul. 19, 1984

[30] Foreign Application Priority Data

Aug. 18, 1983 [DE] Fed. Rep. of Germany ....... 3329808

[51] Int. Cl.$^4$ ........................ H04L 7/02; H04L 27/10
[52] U.S. Cl. ...................................... 375/110; 375/49;
360/42; 360/51; 307/234; 307/517
[58] Field of Search .................... 375/49, 110; 360/42,
360/43, 51; 307/517, 234, 265, 26; 330/270;
328/209

[56] References Cited

U.S. PATENT DOCUMENTS

| | | | |
|---|---|---|---|
| 3,727,202 | 4/1973 | Fort | 360/42 |
| 3,946,322 | 3/1976 | Katz | 307/265 |
| 4,230,970 | 10/1980 | Potter et al. | 307/234 |
| 4,253,187 | 2/1981 | Geise et al. | 375/110 |
| 4,267,595 | 5/1981 | Hernandez | 360/43 |
| 4,277,697 | 7/1981 | Hall et al. | 307/265 |

OTHER PUBLICATIONS

"A Standardised Time-and-Control Code for 625-Line/50-Field Television Tape-Recordings" by R. van der Leeden—Jun. 1973, Journal of the SMPTR, vol. 82—pp. 482–491.

Primary Examiner—Douglas W. Olms
Assistant Examiner—Wellington Chin
Attorney, Agent, or Firm—Frishauf, Holtz, Goodman & Woodward

[57] ABSTRACT

A wide band constant duty cycle pulse train processing circuit where the pulse train frequency varies is proposed. The circuit serves primarily to obtain the basic clock in decoding signals encoded in the bi-phase mark code and includes a pulse-shaping or wave-shaping circuit, which receives the data signals and is followed by a low-pass filter; a differential amplifier circuit, one input of which is connected to the output of the low-pass filter and the other input of which is connected to a variable voltage source; and a current source, controlled by the differential amplifier circuit, at the input of the wave-shaping circuit determining the pulse length. The closed control loop between the output and the input of the wave-shaping circuit that determines the pulse length causes the duty cycle established at the variable voltage source to be maintained over wide ranges of the incident pulse train frequency.

4 Claims, 4 Drawing Figures

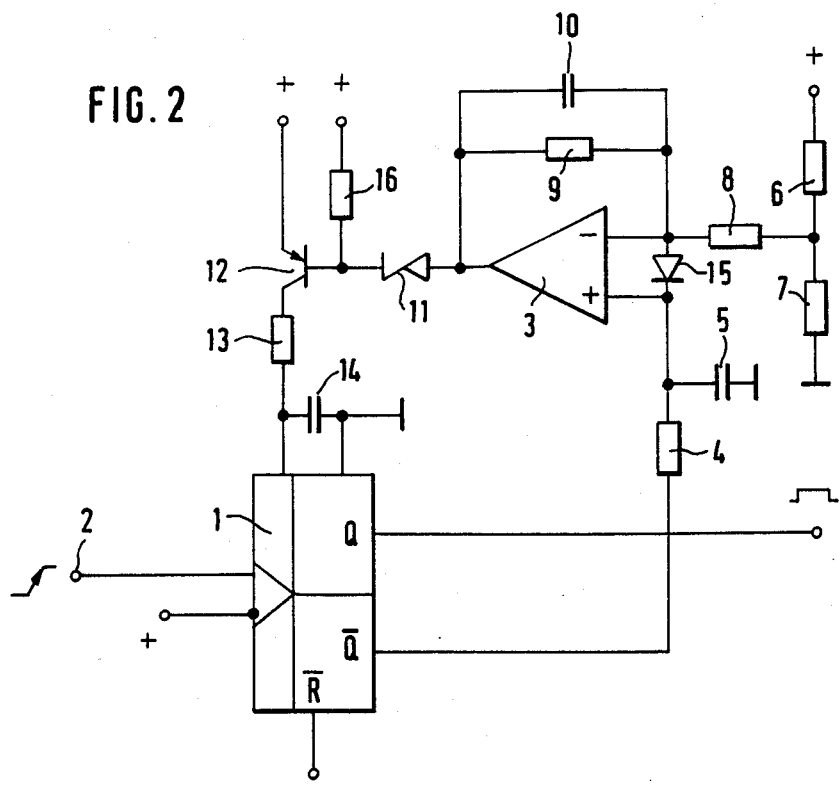

WIDE BAND CONSTANT DUTY CYCLE PULSE TRAIN PROCESSING CIRCUIT

The present invention relates to a processing circuit for pulse-type signals, and more particularly to pulse train signals in which the duty cycle of the pulse train is maintained at a uniform ratio, regardless of variations in frequency of the repetition rate of the pulses in the pulse train. The circuit is particularly applicable to bi-phase mark coded signals.

BACKGROUND

In digital systems, pulses which must be delayed in accordance with a clock signal or must occur in a specific phase position are very often required. Such pulses are needed, for instance, in digital data transmission in order to decode a self-clocking signal. The recording of a binary coded data signal on one longitudinal track of a video tape, where this signal is representative for every location on the tape, is known from the *Journal of the SMPTE*, June, 1973, Vol. 82, pages 482–491. This data signal is recorded in the form of a continuous pulse train, as a sequence of 80-bit words, and it contains a time signal, in the form of an indication of hours, minutes, seconds, and frame number; application-oriented information; and a synchronizing signal. The time signal and the application-oriented information take up 64 bits, and the synchronizing word takes up the remaining 16 bits. The bi-phase mark code, a self-clocking code, has come to be the worldwide standard for encoding this data signal. In this code, a logical "0" is represented by a phase alternation at the end of a bit cell and a logical "1" is represented by an additional phase alternation in the middle of the bit cell.

In order to decode a signal encoded in the bi-phase mark code, the basic clock, that is, each phase alternation at the end of one bit cell, must be recognized. From the basic clock, a gating pulse must be obtained, which isolates the additional phase alternation of a logical "1" and thus converts the signal into a bit sequence of "0" and "1". In this process it is useful to generate a basic clock signal having a duty cycle of 0.75:1, in order to isolate the additional phase or edge alternation in the middle of the bit cell. Circuits for decoding such a signal are known per se. Since this SMPTE signal is recorded in magnetic tape recorders as a time code mark or marking on the tape, however, it undergoes changes in frequency of several decades between slow and fast rewinding, which makes the decoding more difficult.

A method for generating the basic clock on an analog basis is already known, in which the amplitudes of sawtooth wave pulses, which have a duration of one bit cell, are measured. A comparator compares the sawtooth wave amplitude at 75% of the period and thus furnishes the corresponding code clock signal. The disadvantage of the known method is that with increasing clock frequency, the sawtooth wave amplitudes become smaller, and evaluation thus becomes more difficult.

It is also known to obtain the basic clock by means of digital circuitry, by measuring the duration of the previous bit cell with a counter, and during the counting by the counter in the next bit cell to compare the counter state with 75% of the maximal counter state. The disadvantage here is that the circuitry for realizing the counter is complicated and thus extensive in scope and hence costly.

THE INVENTION

It is an object to provide a circuit which permits maintenance, over various decades, of any predetermined and desired duty cycle, that is, a mark-to-space or pulse-to-pulse-gap ratio, and especially to provide such a circuit which is simple and reliable and requires only a minimum of components.

Briefly, a wave-shaping circuit, such as a monostable flip-flop of the like, is provided, generating square-wave pulses. The wave-shaping circuit has a timing control input determining the pulse length of the square-wave pulses. A low-pass filter is connected to receive the square-wave pulses. A course of controllable voltage supplies a command or comparison voltage to one terminal of a differential amplifier which at another input terminal receives the output of the low-pass filter. The differential amplifier controls the current through a controllable current source, such as a transistor, connected to provide current to the control terminal of the wave-shaping circuit.

The suitability of the circuit for integration is particularly advantageous. The circuit is furthermore applicable in many ways, in addition to the purposes of clock recovery and wave shaping for decoding a self-clocking signal. Some possible applications are:

(1) as a wave shaper for pulse advancement with a wide frequency range, e.g., a precision monostable multivibrator or flip-flop in which the temperature drift of the components is compensated for:

(2) as a frequency doubler or frequency divider at a variable input frequency;

(3) as a phase shifter with a constant phase over a frequency range of several decades; and (4) as a phase modulator.

DRAWING

FIG. 1 shows a binary signal train and its pulse diagram in the case of bi-phase mark coding;

FIG. 2 shows the circuit according to the invention, in the form of an exemplarly embodiment;

DETAILED DESCRIPTION

Figure 3:
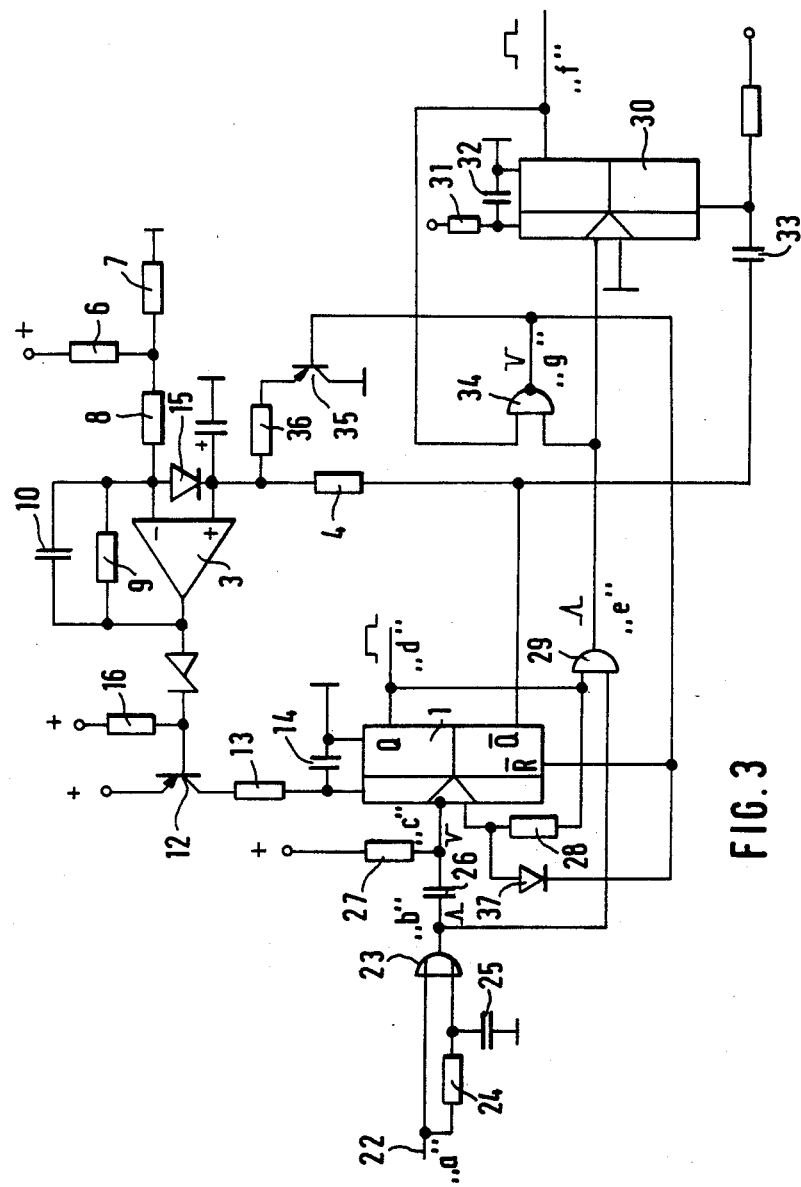
FIG. 3 shows a further exemplary embodiment of the circuit according to the invention for clock recovery and wave shaping, with decoding of a signal train encoded in the bi-phase mark code.

In FIG. 1, a binary signal train is shown, which has three equal values, namely binary "0", proceeding from left to right, initially in succession. A train of binary "1" and "0" signals in alternation then follows. This signal train, encoded by bi-phase marking, results in not only a change in the signal states between a first characteristic level and a second characteristic level at the boundaries of each bit cell, but also a signal edge or level change in the middle of each bit cell which represents a binary "1".

A circuit for generating a pulse train with a constant duty cycle at a varying pulse train frequency is shown in FIG. 2. In this circuit, the trigger input of a monostable multivibrator, or flip-flop (MFF) 1 is connected to the data input 2. The direct input of a differential amplifier 3 is connected via an RC element comprising the resistor 4 and the capacitor 5 with the inverting output $\overline{Q}$ of the MFF 1. The junction of a voltage divider comprising the resistors 6, 7 is connected via the resistor 8 with the inverting input of the differential amplifier 3. From the output of the differential amplifier 3, a feedback circuit with low-pass characteristics and comprising a parallel circuit of a resistor 9 and a capacitor 10 leads to the inverting input of the differential amplifier 3. From the output of the differential amplifier 3, there is a connection via a Zener diode 11 with the base of a transistor 12, the collector of which is connected via a resistor 13 with the network 14 of the MFF 1 that determines the time constant. The base of the transistor 12 is supplied via a resistor 16 with a DC voltage, and the emitter of the transistor 12 is also connected with a source of DC voltage. A diode 15 is disposed between the inverting input and the direct input of the differential amplifier 3. The cathode of the diode 15 is connected with the direct input, and the anode is connected with the inverting input.

OPERATION

With each positive edge of the data signal at the data input 2, the MFF 1 is triggered and initially emits an unchanged pulse train, as long as the regulating circuit, which comprises the low-pass filter 4, 5, the differential amplifier 3, the transistor 12 and the voltage divider 6, 7, has not yet started up. At the direct input of the differential amplifier 3, an average DC-voltage value is established, because of the low-pass character of the RC element 4, 5, which is dependent on the pulse train frequency at the inverting output $\overline{Q}$ of the MFF 1. This average DC-voltage value is compared with the desired or command voltage value present at the inverting input of the differential amplifier 3, which is formed with the aid of the voltage divider 6, 7 and supplied via the resistor 8. The feedback circuit having low-pass characteristics and comprising the parallel circuit of the resistor 9 and the capacitor 10 from the output of the differential amplifier to the inverting input helps to determine the amplification factor of the regulating stage. In like manner, the resistor 8 located between the voltage divider 6, 7 and the inverting input also helps to determine the amplification. The Zener diode 11 between the output of the amplifier 3 and the base of the transistor 12 serves the purpose of level matching. The transistor 12 serves as a source of current for the timing network 14 of the MFF 1 and because of its characteristic curve effects a further, considerable amplification of the DC-voltage value arriving via the Zener diode 11. The resistor between the collector of the transistor 12 and the timing network 14 serves as a protective resistor for the MFF in the event of the transistor 12 becoming conductive to full positive operating voltage. The current through the transistor 12 and hence at the output of the resistor 13, taken together with the capacitance of the capacitor 14, produces a time constant. This time constant determines the ratio of the pulse length to the cycle duration, that is, the duty cycle at the outputs Q and $\overline{Q}$ of the MFF 1. The control loop between the inverting output $\overline{Q}$ and the timing input of the MFF 1 effects the establishment, at the outputs Q and $\overline{Q}$ of the MFF 1, of a duty cycle which is always the same, regardless of the pulse frequency present at the trigger input of the MFF 1. This duty cycle can be prespecified with the aid of the voltage divider 6, 7.

If the pulse train frequency at the trigger input of the MFF 1 varies, then as a consequence of the low-pass characteristic of the overall regulating stage and in particular because of the RC element 4, 5, the pulse width at the direct input of the differential amplifier 3 does not initially vary. A change in the duty cycle thus takes place. After several cycles, the average DC-voltage value at the direct input of the differential amplifier 3 likewise varies, as a consequence of the change in the duty cycle, and the deviation of the average DC-voltage value from the voltage value established at the voltage divider 6, 7 and corresponding to a predetermined duty cycle is recognized by the differential amplifier 3. Because of the variation in the output signal of the differential amplifier 3, the triggering of the base of the transistor 12 is varied, and thus the current in the collector-emitter path of the transistor 12 varies as well. This causes a change in the time constant and the establishment of the predetermined duty cycle at the outputs of the MFF 1 at the new pulse train frequency.

If there is a decrease in the pulse train frequency of the signals present at the input 2, the pulse width at the outputs Q and $\overline{Q}$ of the MFF 1 initially remains the same; that is, the duty cycle becomes smaller. As a result, the average DC-voltage value at the direct input of the differential amplifier 3 drops below the desired or command voltage, which is set at the inverting input with the aid of the voltage divider 6, 7 and is picked up via the resistor 8, and which corresponds to a predetermined duty cycle. The voltage value at the output of the differential amplifier 3, and hence the voltage at the base of the transistor 12, increases. The flow of current in the collector-emitter path of the transistor 12 decreases, and the charge voltage for the capacitor 14 thus drops as well.

The charging of the capacitor 14 to a predetermined voltage value extends over a relatively long period of time. The MFF is thus reset later, the pulse width is increased, and the duty cycle is thus increased as well. After several cycles, a duty cycle has become established at the outputs Q and $\overline{Q}$ of the MFF which corresponds to the value predetermined at the voltage divider 6, 7.

If contrarily the signal frequency at the input 2 of the MFF 1 increases, while the pulse width remains unchanged, the duty cycle at the outputs Q and $\overline{Q}$ of the MFF 1 is increased. As a result, the average DC-voltage value at the direct input of the differential amplifier 3 increases above the command voltage value set at the inverting input with the aid of the voltage divider 6, 7. The output signal of the differential amplifier 3 assumes a lower level, causing the voltage at the base of the transistor 12 to drop as well. The flow of current in the collector-emitter path of the transistor 12 is increased. The voltage at the ungrounded side of the capacitor 14 thus increases, causing an acceleration of the charging of this capacitor. The MFF 1 is therefore reset earlier, and the pulse width at the outputs Q and $\overline{Q}$ increases. After several cycles, the duty cycle has stabilized to the value established at the voltage divider 6, 7.

In one practical exemplary embodiment, the components in a circuit for wave shaping in the decoding of a signal encoded by the bi-phase mark code had the following specifications:

Monostable multivibrator 1: Type MC 14528 (MC 14538)
Differential amplifier 3: TL 022
Resistors 4, 9: 100 k
Resistors 8, 13, 16: 5.1 k
Capacitor 5: 47μ
Capacitor 14: 1n
Capacitor 10: 220n
Transistor 12: Type 2N3906

Zener diode 11: Type ZPT 2.7.

The resistance values for the resistors 6, 7 are derived from the formula $$V = \frac{t}{T} = 1 - \frac{R2}{R1 + R2},$$

in which V is the desired duty cycle, t is the pulse length, T the cycle duration, R 1 the resistance value for the resistor 6 and R 2 the resistance value for the resistor 7.

On starting up the circuit of FIG. 2, it is possible for the signal train to contain nothing but logical "1" and thus for a pulse length to amount to 75%, but not of the basic cycle. Furthermore, upon startup the MFF 1 can be operated with a completely different time constant, and a pulse length thereby generated which likewise amounts to 75%, but in this case 75% of a harmonic of the basic clock cycle. The circuit of FIG. 2 is therefore expanded according to FIG. 3 for the purpose of pulse-shaping in decoding a signal encoded by the bi-phase mark code. Elements identical to those in FIG. 2 and having the same functions are identified by the same reference numerals as before. The layout and operation of the circuit of FIG. 3 will now be described, referring also to the pulse diagram of FIG. 4, in which signals of the graphs a to g occurring in the circuit have been similarly lettered.

Figure 4:
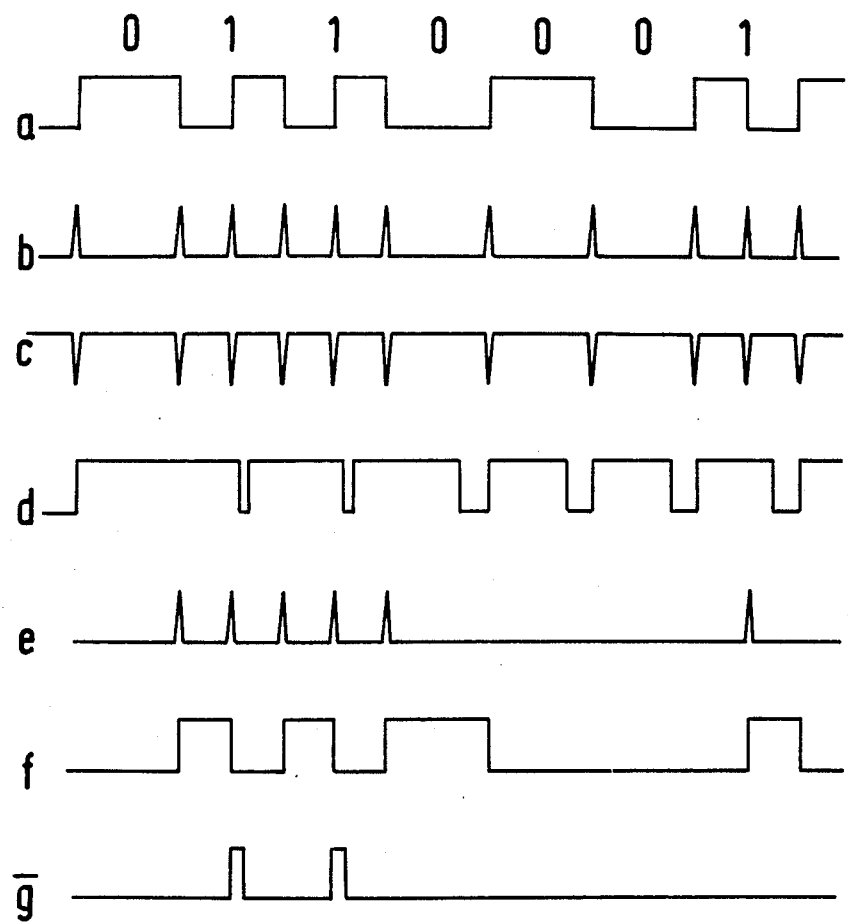
FIG. 4 shows the pulse diagram when the signal train of FIG. 1 is decoded with the circuit of FIG. 3.

In order to obtain the basic clock from a signal train encoded by the bi-phase mark code according to FIG. 4, graph a, or in other words to suppress the additional pulse edges marking the logical "1" inside the bit cell, a feedback to the clock lock-out input of the MFF 1 is provided. The signal in bi-phase mark code present at the input 22 (FIG. 4, graph a) is differentiated by means of an exclusive OR gate 23, with a unilateral retardation by the RC element 24, 25. Each pulse edge of the input signal appears at the output of the exclusive OR gate 23 in the form of a needle pulse, as shown in FIG. 4, graph b. By a re-differentiation with the aid of the RC element 26, 27, the polarity of the needle pulses is varied as shown in FIG. 4, graph c. To this end, the trailing edge of the needle pulse b is differentiated once again, in order to obtain the desired polarity at the input of the MFF 1. Since in the bi-phase mark code the doubled frequency, as compared with the basic frequency, is also present whenever a logical "1" having an additional pulse edge in the middle of the bit cell is transmitted, feedback must be provided to suppress these additional edges, if the basic clock is to be obtained from the mixture of signals. This feedback is effected from output Q of the MFF 1 (FIG. 4, graph d) via the resistor 28 to the clock lock-out input of the MFF 1. For the purpose of explanation, let it be assumed that the control loop for keeping the duty cycle constant was initially erroneously started (FIG. 4, graph d). In accordance with the concept that an effective suppression of the additional edges in the middle of the bit cells will be effected if the pulse width is selected to be 75% of the basic cycle duration, then after 75% of the cycle duration of the "0" bit cell a falling edge would have to appear, and at 100% of the cycle deviation of the "0" bit cell, a rising edge would again have to appear. This does not happen however, because during the startup period, the time constant was, for instance, set to be too long. With the aid of the decoding device connected to the output, an error signal is therefore generated in order to reset the pulse length to 75% of the cycle deviation.

In the started-up state, additional edges in the middle of the bit cell, which characterize logical "1", are isolated by means of the AND gate 29. To this end, the differentiated input edges from the output of the exclusive OR gate 23 are delivered to one input of the AND gate 29, and the shaped pulses, set to 75% of the cycle duration, from the Q output of the MFF 1 are delivered to the other input of the AND gate 29. Upon the appearance of a needle pulse as shown in FIG. 4, graph 3, during the course of a pulse as shown in FIG. 4, graph c, a pulse corresponding to FIG. 4, graph e appears at the output of the AND gate 29, which represents the additional edge in the middle of the bit cell for the logical "1" encoded by the bi-phase mark code.

During the startup of the control loop for establishing the time constant, this time constant can initially be at some different value, for instance 99% of the recognized cycle duration. Additionally, the control loop may also have started up to an erroneous cycle duration, for example 3/2 cycles at the appearance of one or more logical "1"s. In that case, not only the additional edges in the middle of the bit cell, but the second edges of the basic clock at the end of a regular basic period as well, are suppressed. A proper decoding will not take place. An RS flip-flop 30 is therefore triggered with the pulses of FIG. 4, graph e from the output of the AND gate 29. In the practical realization of the circuit, the second monostable multivibrator, which is structurally combined in one component, e.g., on one chip, is connected as an RS flip-flop. To this end, the time constant is selected with the aid of the resistor 31 and the capacitor 32 to be very long as compared with the longest incident cycle duration of the input signal. As a result, the resetting of the flip-flop 30 is reliably effected via the reset input R.

Upon the appearance of a pulse "e" at the trigger input, which of course represents the additional edge in the middle of the bit cell of the logical "1", the RS flip-flop 30 is set. The reset input of the RS flip-flop 30 is connected via the capacitor 33 with the $\overline{Q}$ output of the MFF 1. The RS flip-flop 30 is therefore reset with the next edge "c" that appears, which simultaneously starts the MFF 1. A logical "1" in the continuing data signal is thus recognized (FIG. 4, graph f).

In the case of error, as noted above, the pulse length at the outputs of the MFF 1 amounts for instance to almost 3/2 cycles. As a result, not only the actual intermediate edge of the logical "1" is recognized as such, and delivered as a pulse shown in FIG. 4, graph c to the trigger input of the RS flip-flop 30, but further pulse edges which are located within the (overly long) cycle deviation are recognized as well. Since in this case the pulse shown in FIG. 4, graph f is still present at the output of the RS flip-flop, because there has been no resetting in the meantime, an output signal shown in FIG. 4, graph $\overline{g}$ is obtained from the pulses shown in FIG. 4, graphs e and f, with the aid of the NAND gate 34; with this output signal of FIG. 4, graph $\overline{g}$, the control voltage of the differential amplifier 3 is "yanked" down via the transistor 35 and the resistor 35, and the MFF 1 is simultaneously reset and restarted via the diode 37. The pulses shown in graph g are actually negative, and the graph, therefore, is labelled $\overline{g}$. As a result of the brief downward excursion of the voltage at the emitter of the transistor 35, the actual voltage at the differential amplifier, as an average direct-voltage value, is varied in the same manner, because of the low-pass behavior of the RC combination 36, 5, as if the pulse length amounted to more than 75% of the recognized cycle duration. The output signal of the differential amplifier becomes more negative, and the transistor 12 becomes more conductive. An increased current flows through the emitter-collector path of the transistor 12, and the increased current charges the capacitor 14 determining the time constant of the MFF 1 more rapidly: the pulse length "d" (see FIG. 4, graph $\bar{g}$) becomes shorter. After several cycles, control arrives at the correct basic grid of the basic clock. Subsequently, the intermediate edges of the logical "1" are recognized and the "1" is decoded, but the error recognition circuit still has no function, because the RS flip-flop 30 is reset after 75% of the cycle duration, and no further pulse "e" (FIG. 4, graph e) appears at the trigger input of the RS flip-floop in the meantime. The resetting of the MFF 1 by the pulses shown in FIG. 4, graph g thus causes the control, which has oriented itself to 75% of the erroneous cycle duration, now to treat this pulse length as if it were above 75%, and hence to shorten the pulse length until such time as no further pulses "$\bar{g}$" appear.

I claim:

1. A pulse train processing circuit to generate, from an input pulse train of variable pulse repetition frequency, an output pulse train with a constant, predetermined duty cycle, comprising, in accordance with the invention,
   a wave-shaping circuit (1) having a data input (2, 22), generating square-wave pulses of a length or duration (d) and having a control input (13, 14) determining the pulse length (d) of the square-wave pulses at an output thereof;
   a decoding circuit (29) connected to the output of said wave-shaping circuit (1) for recognition, in a signal train encoded in bi-phase mark code wherein bit cell boundaries are denoted by a phase alternation, and isolation of an additional phase alternation in the middle of a bit cell indicating that said bit cell represents a logical "1";
   a recognition circuit (34) connected to the output of the decoding circuit (29) for isolating any multiple additional phase alternations within a period of time recognized as a basic clock period;
   a low-pass filter (4, 5) connected to receive the square-wave pulses from said wave-shaping circuit (1);
   a source of controllable voltage (6, 7) supplying a comparison or command voltage;
   a differential amplifier (3) receiving, as one input, the output of the low-pass filter (4, 5) and, as another input, the comparison or command voltage of the controllable voltage source;
   a transistor circuit (35) connected to the output of said recognition circuit (34) and acting upon said differential amplifer (3) so as to shorten said pulse duration (d); and
   a controlled current source (12) connected to and controlled by the output from the differential amplifier (3) and supplying a controlled current to the control input (13, 14) of the wave-shaping circuit (1).

2. Circuit according to claim 1, wherein the wave-shaping circuit (1) comprises a monostable flip-flop (MFF) (1), having an inverting output;
   the low-pass filter comprises an R C filter connected in low-pass configuration to the inverting output of the MFF, and being coupled and connected to one of the inputs of the differential amplifier;
   the source of controllable voltage comprises a voltage divider (6, 7) connected to another input terminal of the differential amplifier;
   and wherein the controlled current source (12) comprises a transistor (12) having its base connected to the output of the differential amplifier, and its emitter-collector path connected to the timing control input of the MFF (1).

3. A circuit according to claim 1,
   wherein the wave-shaping circuit (1) is reset and simultaneously restarted by pulses generated at the output of the recognition circuit (34).

4. A circuit according to claim 3, further comprising at least one differentiating circuit (24, 25, 26, 27) for differentiating incoming data signals at the input (22) of the wave-shaping circuit (1);
   a multivibrator circuit (30) at the output of the decoding circuit (29); and
   a connection of a resetting input of the wave-shaping circuit (1) to the output of the recognition circuit (34).

* * * * *